(12) United States Patent
Imaizumi

(10) Patent No.: US 10,039,200 B2
(45) Date of Patent: Jul. 31, 2018

(54) ENGAGEMENT STRUCTURE, ELECTRONIC COMPONENT MODULE, AND ELECTRICAL CONNECTION BOX

(71) Applicant: Yazaki Corporation, Tokyo (JP)

(72) Inventor: Yoshihito Imaizumi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/359,172

(22) Filed: Nov. 22, 2016

(65) Prior Publication Data

US 2017/0164496 A1 Jun. 8, 2017

(30) Foreign Application Priority Data

Dec. 2, 2015 (JP) ................................. 2015-235474

(51) Int. Cl.
*H05K 7/02* (2006.01)
*H05K 7/04* (2006.01)
(Continued)

(52) U.S. Cl.
CPC ............... *H05K 7/02* (2013.01); *H01R 12/58* (2013.01); *H01R 12/724* (2013.01);
(Continued)

(58) Field of Classification Search
CPC ...... H05K 5/03; H05K 5/0221; H05K 5/0073; H05K 7/02; H01R 12/58; H01R 12/724; B60R 16/023
(Continued)

(56) References Cited

U.S. PATENT DOCUMENTS 6,178,094 B1 * 1/2001 Hakozaki ............. H05K 7/1418
16/95 R
6,462,955 B1 * 10/2002 Roberts .................. H05K 3/303
174/268
(Continued)

FOREIGN PATENT DOCUMENTS

CN 101593951 A 12/2009
CN 101662133 A 3/2010
(Continued)

OTHER PUBLICATIONS

Chinese Office Action for the related Chinese Patent Application No. 201611088334.4 dated Feb. 5, 2018.
(Continued)

*Primary Examiner* — Hung S Bui
(74) *Attorney, Agent, or Firm* — Kenealy Vaidya LLP

(57) ABSTRACT

An engagement structure includes a block that has first and second side surfaces, and that holds an electronic component; a cover that has first inner wall surfaces facing the first side surfaces and second inner wall surfaces facing the second side surfaces; an engagement mechanism that includes a projecting engagement portion provided on either one of the first side surface and corresponding first inner wall surface and an recessed engagement portion provided in the other thereof; and a projection that is provided on one surface of the second side surface and corresponding second inner wall surface, and that is in contact with the other surface thereof to press the other surface so as to restrain the first side surfaces and the first inner wall surfaces from relatively moving in directions separating from each other in an engaged state of the engagement mechanism.

4 Claims, 9 Drawing Sheets

(51) Int. Cl.
*H01R 12/58* (2011.01)
*H01R 12/72* (2011.01)
*H05K 5/02* (2006.01)
*H05K 5/03* (2006.01)
*H05K 5/00* (2006.01)
*B60R 16/023* (2006.01)

(52) U.S. Cl.
CPC ......... *H05K 5/0073* (2013.01); *H05K 5/0221* (2013.01); *H05K 5/03* (2013.01); *B60R 16/023* (2013.01)

(58) Field of Classification Search
USPC .......................................... 361/807, 809, 810
See application file for complete search history.

(56) References Cited

U.S. PATENT DOCUMENTS

| | | | | |
|---|---|---|---|---|
| 6,850,421 | B2* | 2/2005 | Boyd | H01H 85/2045 361/797 |
| 7,950,931 | B2* | 5/2011 | Nakanishi | H02G 3/088 439/76.2 |
| 8,002,569 | B2 | 8/2011 | Ikeda et al. | |
| 9,025,344 | B2* | 5/2015 | Lee | H01H 50/021 361/752 |
| 2001/0027039 | A1 | 10/2001 | Okabe et al. | |
| 2009/0298310 | A1 | 12/2009 | Nakanishi et al. | |
| 2010/0055962 | A1 | 3/2010 | Ikeda et al. | |
| 2015/0305181 | A1* | 10/2015 | Kurita | H05K 7/026 361/679.01 |

FOREIGN PATENT DOCUMENTS

| | | |
|---|---|---|
| JP | 2005-160207 A | 6/2005 |
| JP | 2008-305869 A | 12/2008 |
| JP | 2010-283909 A | 12/2010 |
| JP | 2011-30332 A | 2/2011 |
| JP | 2011-48995 A | 3/2011 |
| JP | 2011-193594 A | 9/2011 |
| JP | 2013-158215 A | 8/2013 |

OTHER PUBLICATIONS

Japanese Office Action for the related Japanese Patent Application No. 2015-235474 dated Mar. 20, 2018.

* cited by examiner

ENGAGEMENT STRUCTURE, ELECTRONIC COMPONENT MODULE, AND ELECTRICAL CONNECTION BOX

CROSS-REFERENCE TO RELATED APPLICATION(S)

The present application claims priority to and incorporates by reference the entire contents of Japanese Patent Application No. 2015-235474 filed in Japan on Dec. 2, 2015.

BACKGROUND OF THE INVENTION

1. Field of the Invention

The present invention relates to an engagement structure, an electronic component module, and an electrical connection box.

2. Description of the Related Art

Engagement structures have been known, each of which engages a block with a cover that covers the block and electronic components in an integrated manner. Japanese Patent Application Laid-open No. 2011-193594 discloses a technique of an electrical connection box that includes a case that is provided with an opening opened downward and accommodates therein a circuit board, and also includes a connector that is assembled with the case and closes the opening. A locking portion projecting outward is provided on an outer wall of the connector. In the electrical connection box of Japanese Patent Application Laid-open No. 2011-193594, the locking portion elastically engages with a lock receiving portion formed in a sidewall of the case so as to assemble the connector with the case in an integrated manner.

SUMMARY OF THE INVENTION

In the case where the block is engaged with the cover by an engagement mechanism, such as the locking portion and the lock receiving portion described above, the reliability of the engagement mechanism is desired to be improved. For example, the engagement state of the engagement mechanism can desirably be restrained from being released due to vibration or impact.

It is an object of the present invention to provide an engagement structure, an electronic component module, and an electrical connection box that are capable of improving the reliability of the engagement mechanism.

In order to achieve the above mentioned object, an engagement structure according to one aspect of the present invention includes a block that has a first side surface and a second side surface, and that holds an electronic component; a cover that has a first inner wall surface facing the first side surface and a second inner wall surface facing the second side surface, and that covers the block and the electronic component in an integrated manner; an engagement mechanism that includes a projecting engagement portion provided on one of the first side surface and the first inner wall surface and an recessed engagement portion provided in the other of the first side surface and the first inner wall surface; and a projection that is provided on one surface of the second side surface and the second inner wall surface, and configured to be in contact with the other surface of the second side surface and the second inner wall surface to press the other surface so as to restrain the first side surface and the first inner wall surface from relatively moving in directions separating from each other in an engaged state of the engagement mechanism.

According to another aspect of the present invention, in the engagement structure, it is preferable that the projection presses the other surface to deform the cover so that the first side surface and the first inner wall surface get close to each other.

According to still another aspect of the present invention, in the engagement structure, it is preferable that the second side surface is a surface intersecting the first side surface, and the projection is located at an end on the first side surface side of the second side surface.

According to still another aspect of the present invention, an electronic component module includes an electronic component; a block that has a first side surface and a second side surface, and that holds the electronic component; a cover that has a first inner wall surface facing the first side surface and a second inner wall surface facing the second side surface, and that covers the block and the electronic component in an integrated manner; an engagement mechanism that includes a projecting engagement portion provided on one of the first side surface and the first inner wall surface and an recessed engagement portion provided in the other of the first side surface and the first inner wall surface; and a projection that is provided on one surface of the second side surface and the second inner wall surface, and configured to be in contact with the other surface of the second side surface and the second inner wall surface to press the other surface so as to restrain the first side surface and the first inner wall surface from relatively moving in directions separating from each other in an engaged state of the engagement mechanism.

According to still another aspect of the present invention, an electrical connection box includes an electronic component; a block that has a first side surface and a second side surface, and that holds the electronic component; a cover that has a first inner wall surface facing the first side surface and a second inner wall surface facing the second side surface, and that covers the block and the electronic component in an integrated manner; an engagement mechanism that includes a projecting engagement portion provided on one of the first side surface and the first inner wall surface and an recessed engagement portion provided in the other of the first side surface and the first inner wall surface; a projection that is provided on one surface of the second side surface and the second inner wall surface, and configured to be in contact with the other surface of the second side surface and the second inner wall surface to press the other surface so as to restrain the first side surface and the first inner wall surface from relatively moving in directions separating from each other in an engaged state of the engagement mechanism; and a frame that holds therein an electronic component module including the electronic component, the block, and the cover.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes in detail an engagement structure, an electronic component module, and an electrical connection box according to an embodiment of the present invention, with reference to the drawings. The embodiment will not limit the present invention. Components in the following embodiment include those easily conceivable by those skilled in the art, and those that are substantially the same.

Embodiment

Figure 1:
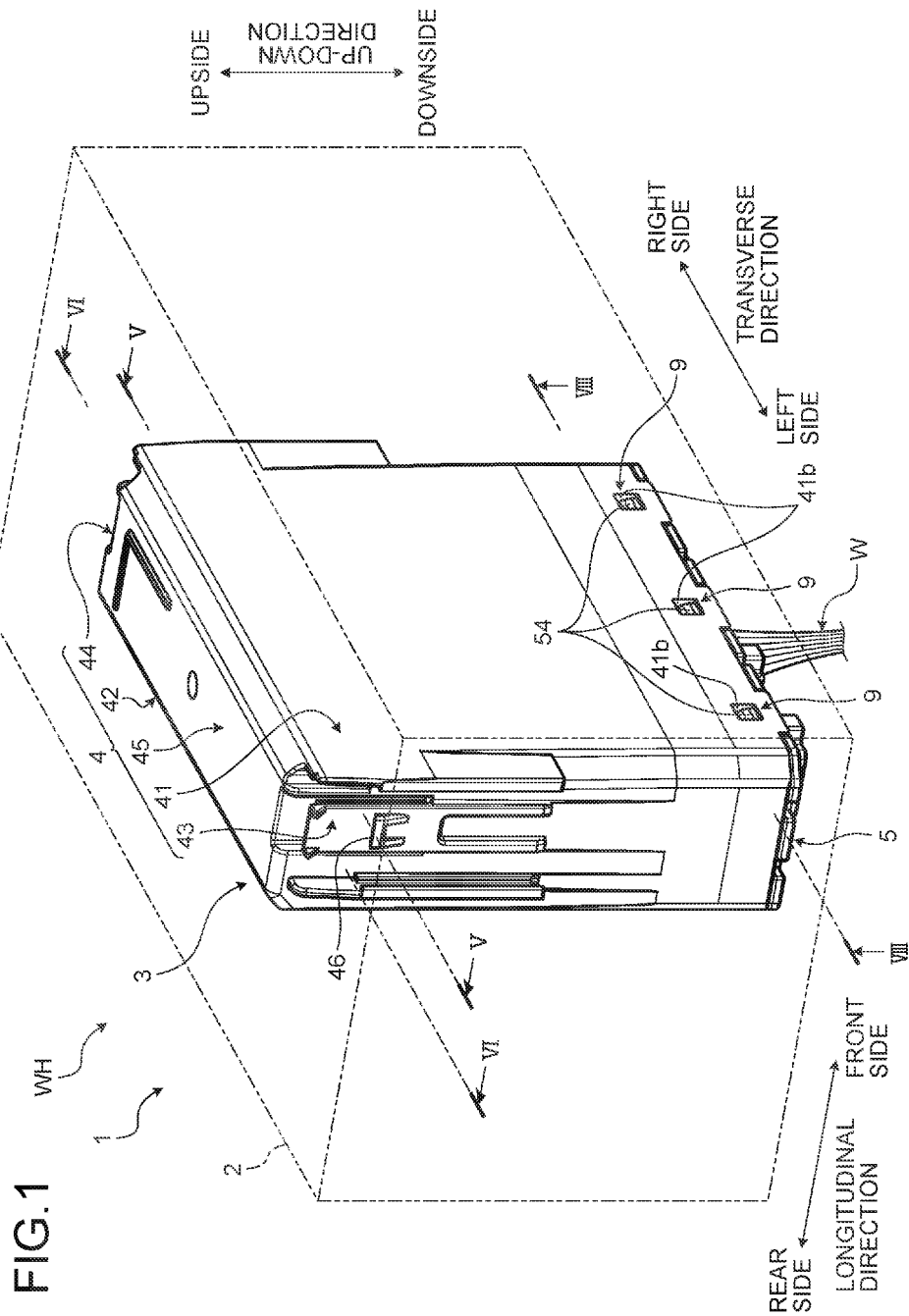
FIG. 1 is a perspective view of an electrical connection box according to an embodiment.
Figure 2:
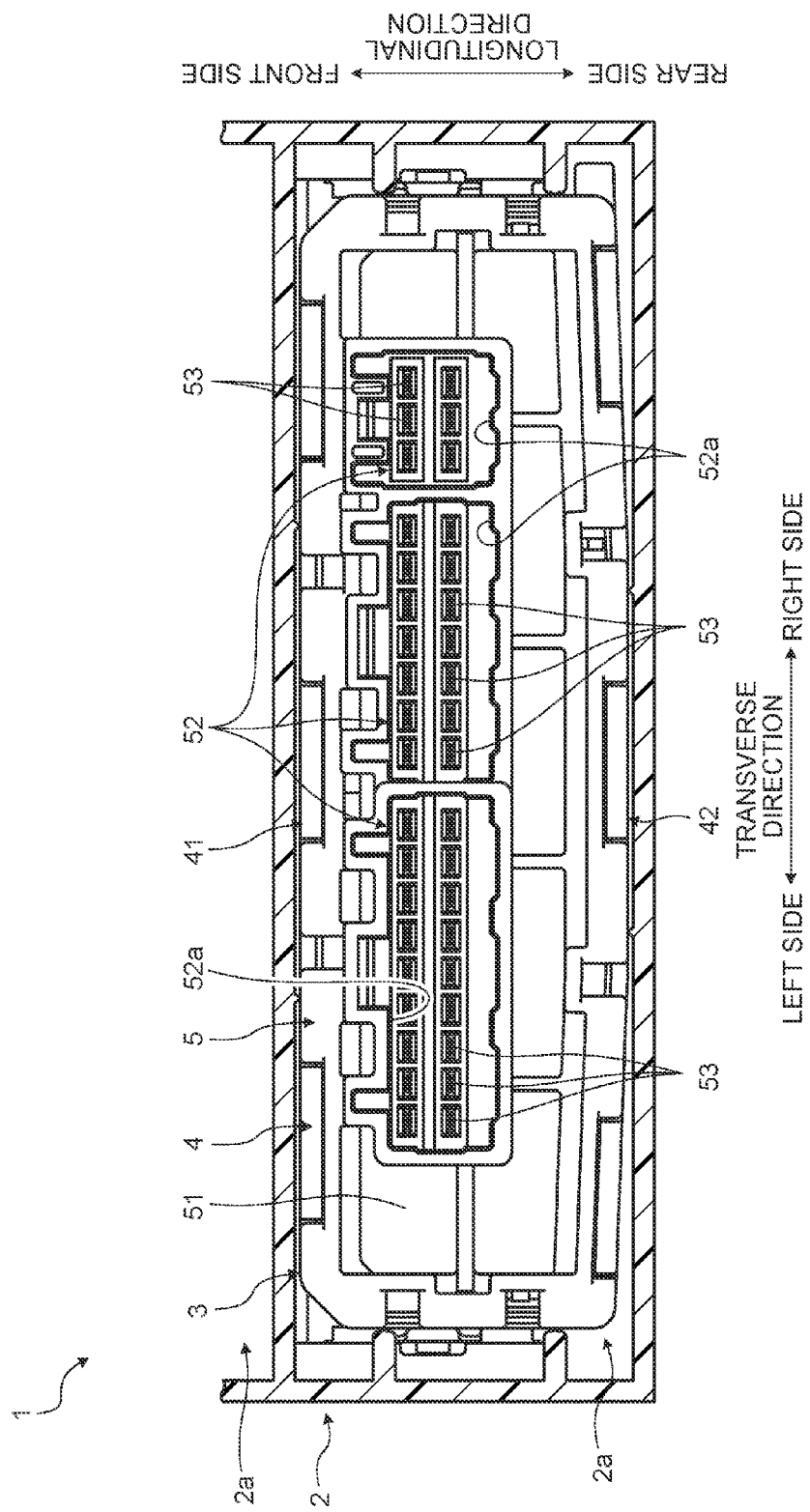
FIG. 2 is a bottom view of the electrical connection box according to the embodiment.
Figure 3:
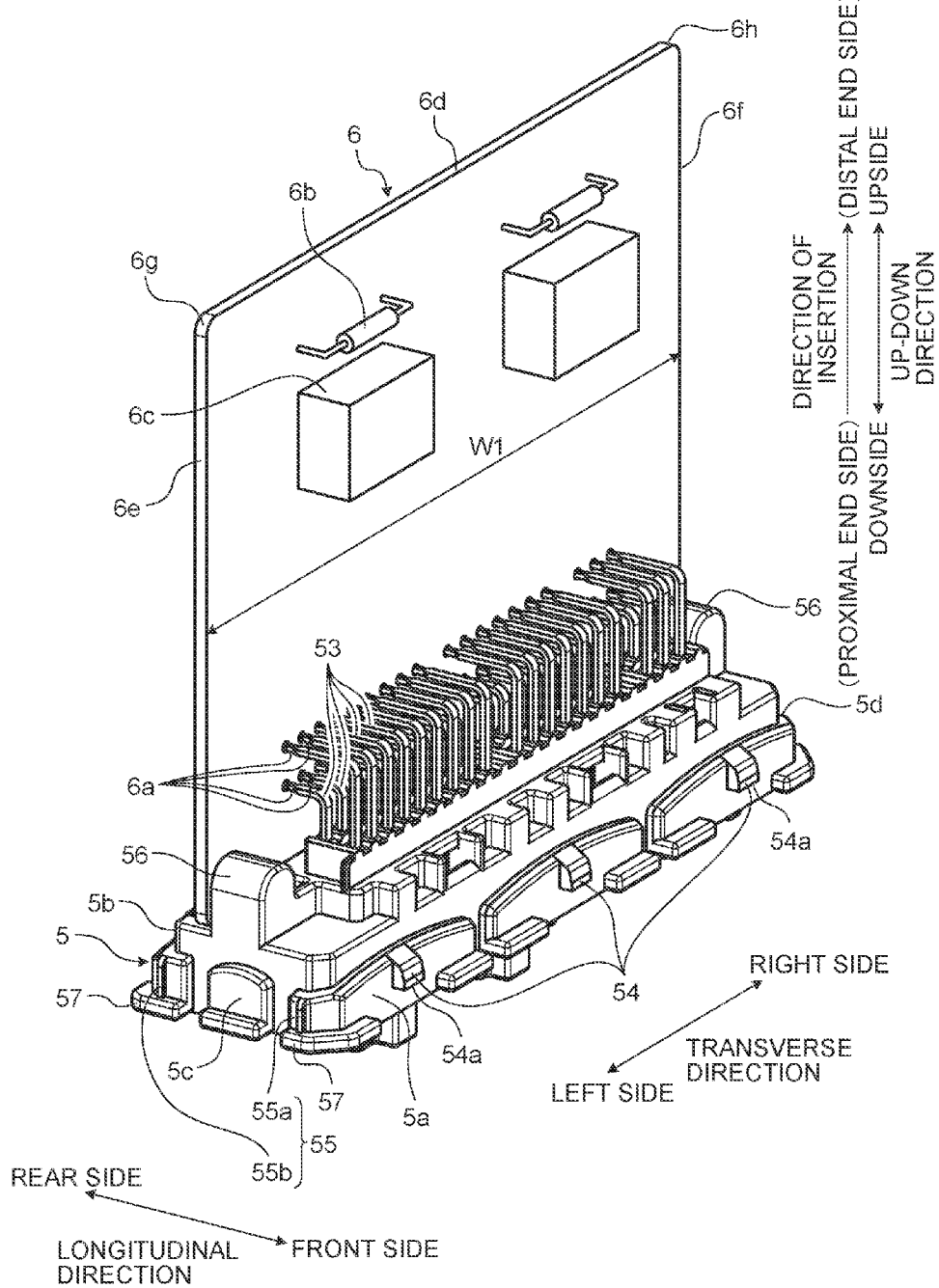
FIG. 3 is a perspective view of a circuit board and a connector block according to the embodiment.
Figure 4:
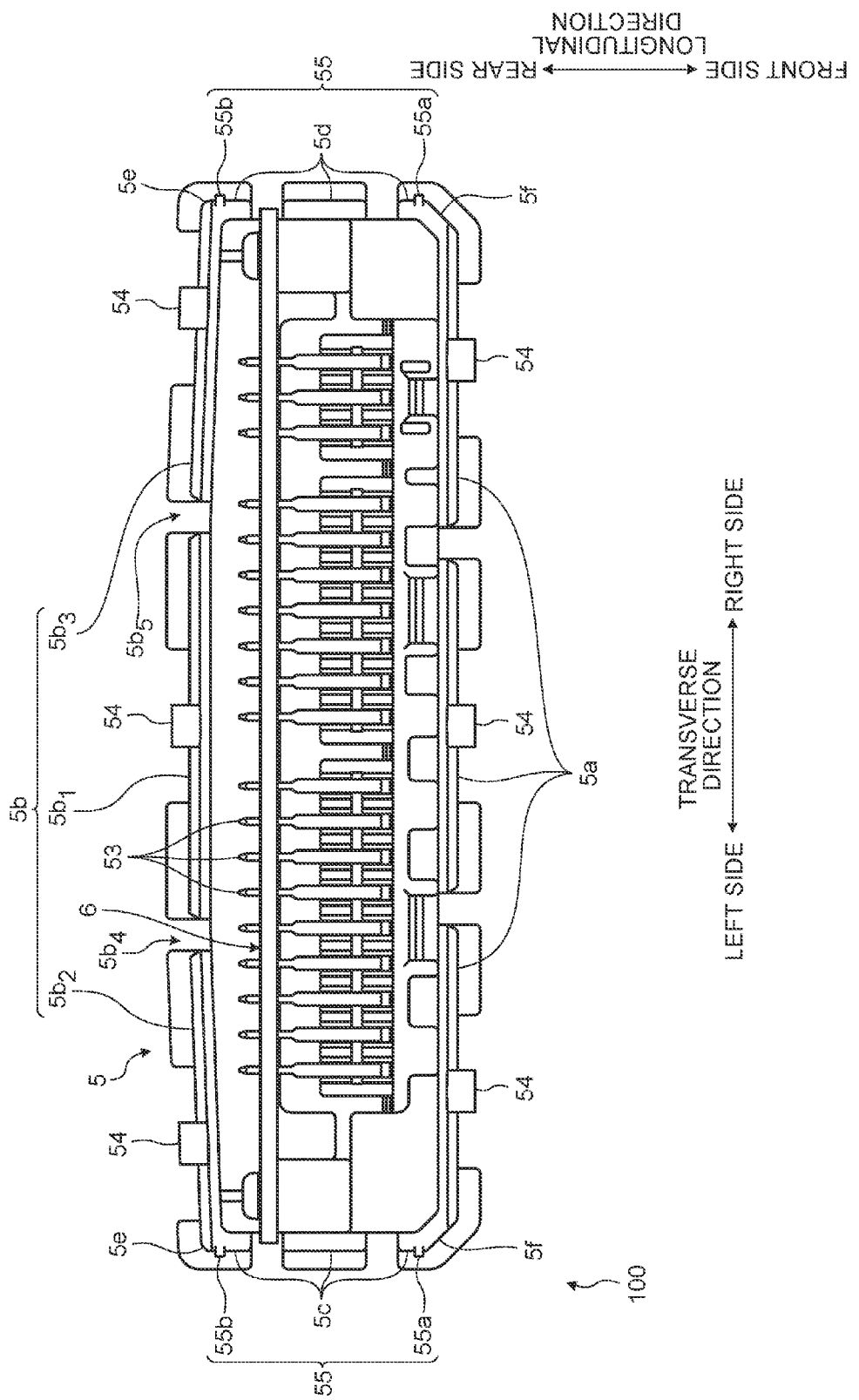
FIG. 4 is a plan view of the circuit board and the connector block according to the embodiment.
Figure 5:
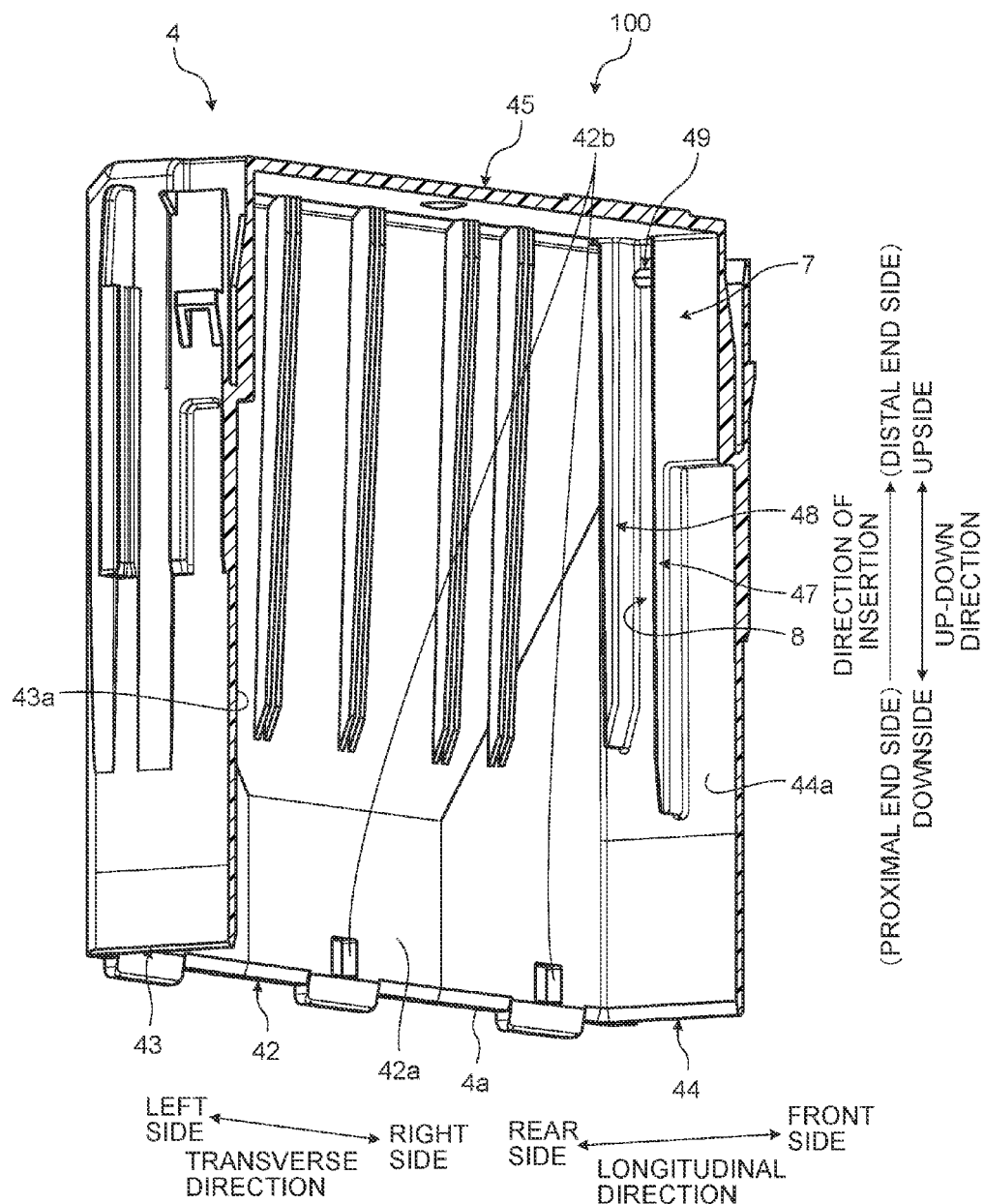
FIG. 5 is a sectional perspective view of a cover according to the embodiment.
Figure 6:
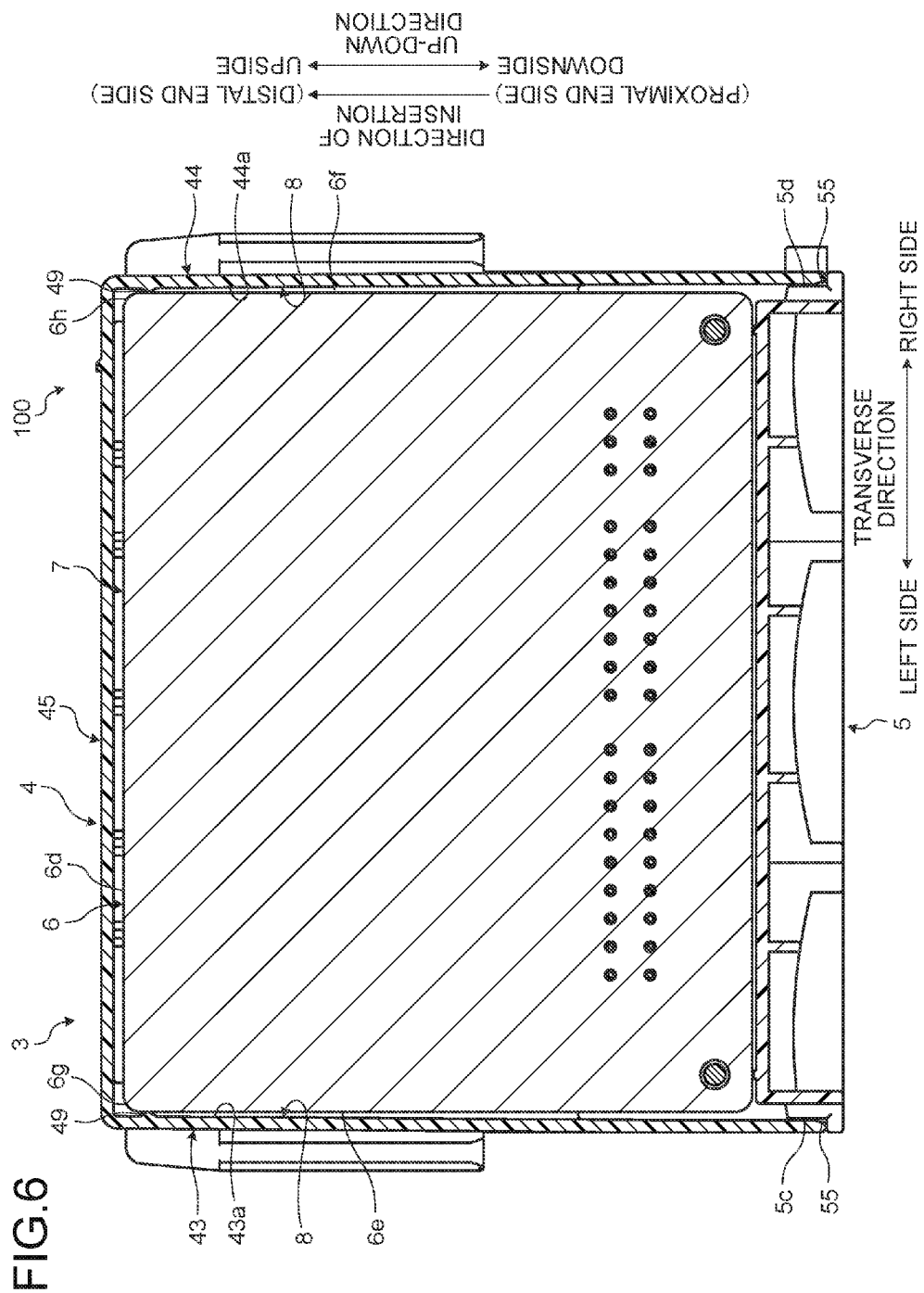
FIG. 6 is a sectional view of an electronic component module according to the embodiment.
Figure 7:
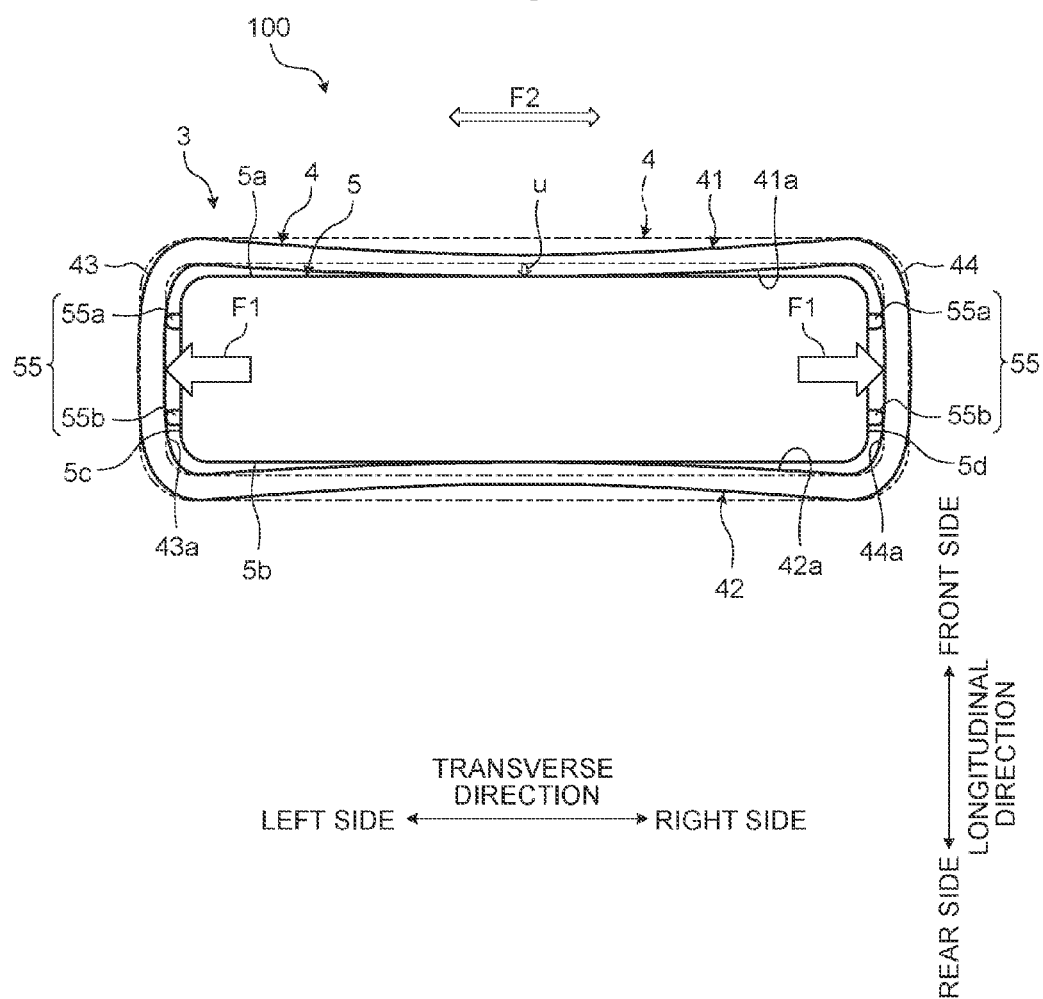
FIG. 7 is a bottom view illustrating deformation of the cover.
Figure 8:
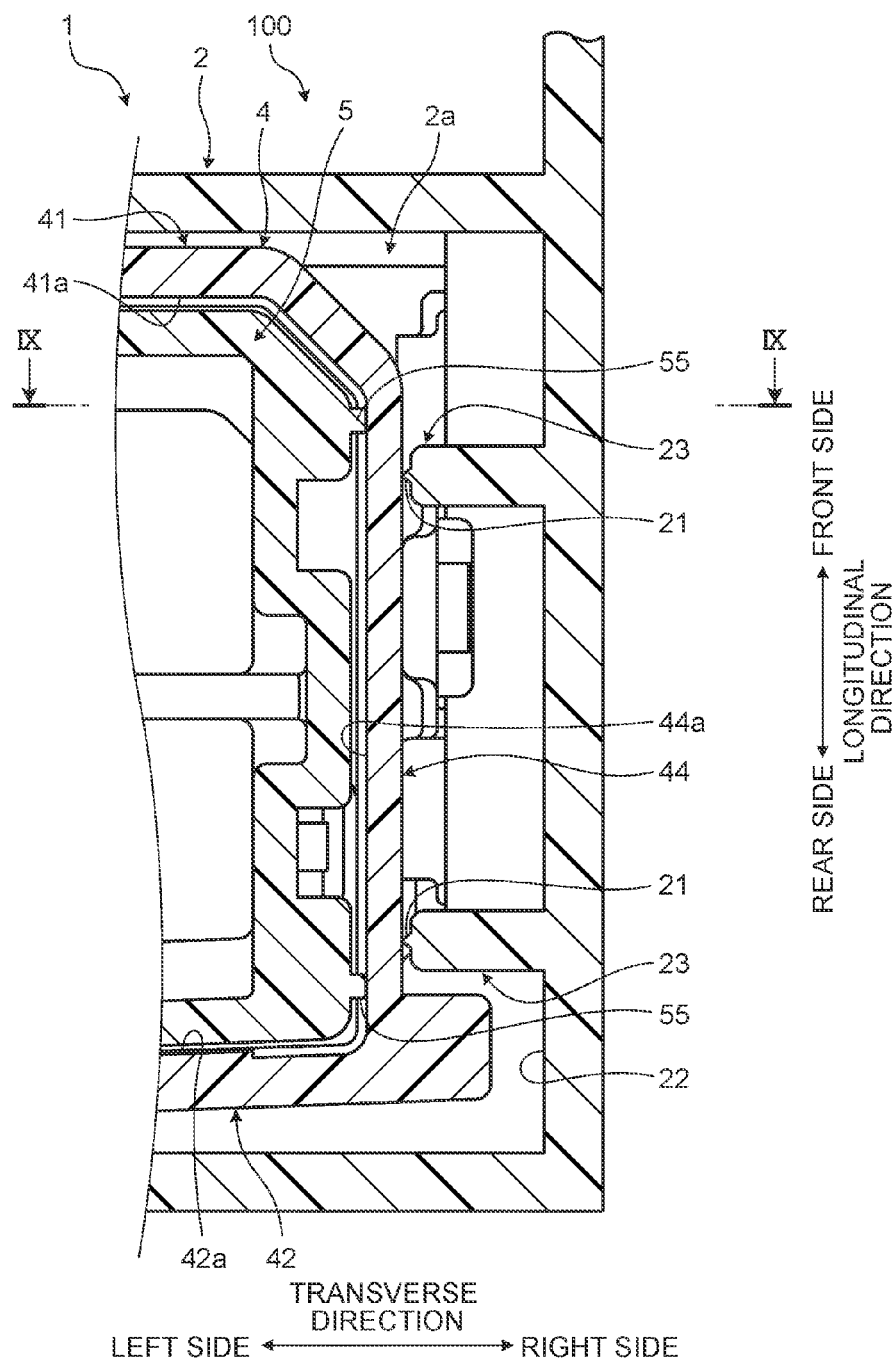
FIG. 8 is a sectional view illustrating frame-side projections according to the embodiment.
Figure 9:
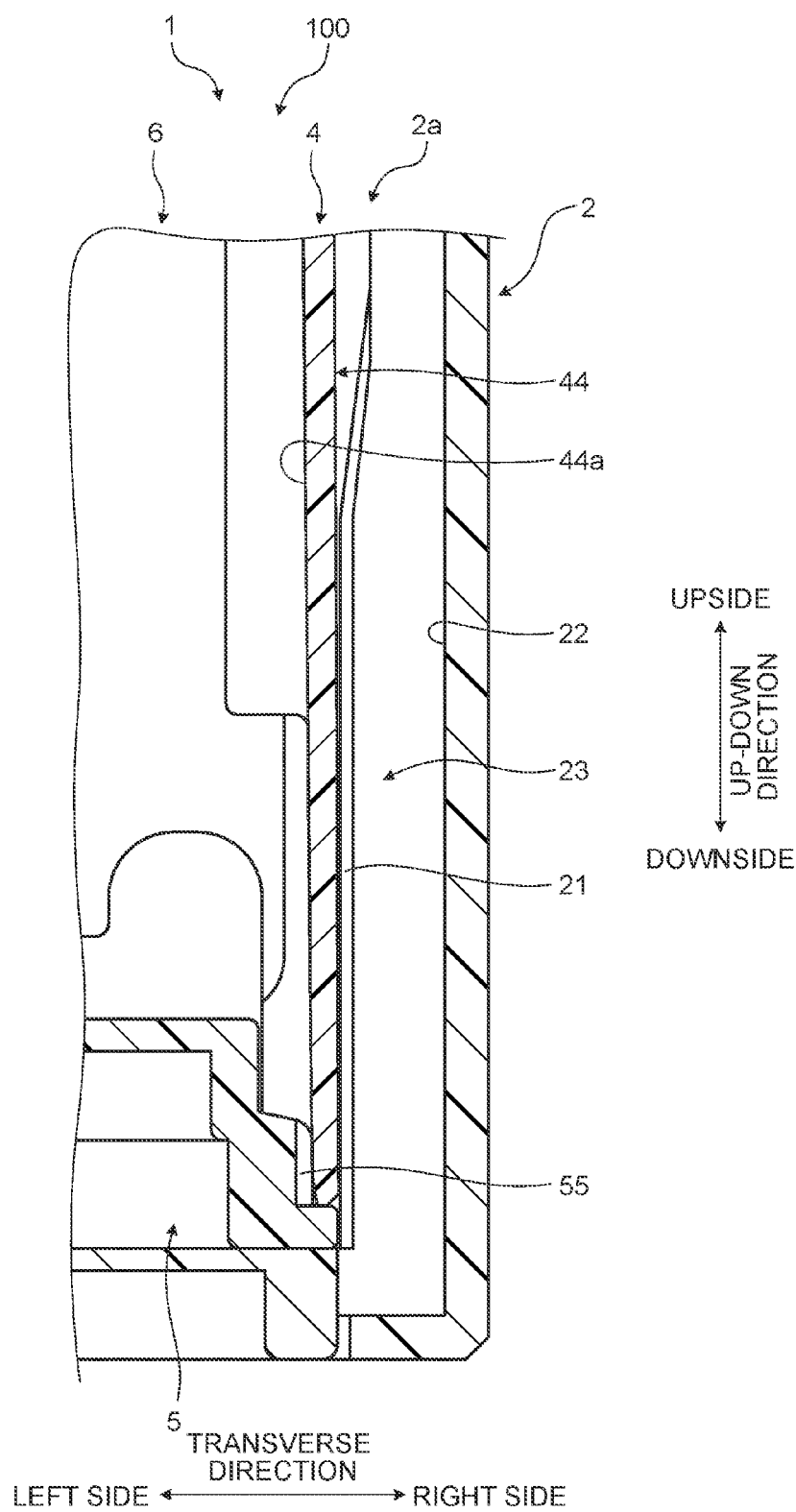
FIG. 9 is another sectional view illustrating the frame-side projection according to the embodiment.

The embodiment will be described with reference to FIGS. 1 to 9. The present embodiment relates to the engagement structure, the electronic component module, and the electrical connection box. FIG. 1 is a perspective view of the electrical connection box according to the embodiment; FIG. 2 is a bottom view of the electrical connection box according to the embodiment; FIG. 3 is a perspective view of a circuit board and a connector block according to the embodiment; FIG. 4 is a plan view of the circuit board and the connector block according to the embodiment; FIG. 5 is a sectional perspective view of a cover according to the embodiment; FIG. 6 is a sectional view of an electronic component module according to the embodiment; FIG. 7 is a bottom view illustrating deformation of the cover; FIG. 8 is a sectional view illustrating frame-side projections according to the embodiment; and FIG. 9 is another sectional view illustrating one of the frame-side projections according to the embodiment. FIG. 5 is a sectional view of FIG. 1 along the V-V line; FIG. 6 is a sectional view of FIG. 1 along the VI-VI line; FIG. 8 is a sectional view of FIG. 1 along the VIII-VIII line; and FIG. 9 is a sectional view of FIG. 8 along the IX-IX line.

As illustrated in FIG. 1, an electrical connection box 1 according to the present embodiment includes a frame 2 and an electronic component module 3. In the present embodiment, the electrical connection box 1 will be described by way of an example in which the electrical connection box 1 is mounted on a vehicle. The electrical connection box 1 constitutes a wire harness WH, together with electric wires W. The wire harness WH is mounted on the vehicle, such as an automobile, and connects devices mounted on the vehicle with one another. The wire harness WH includes the electric wires W used for power supply and signal communication. One end of each of the electric wires W is connected to the electronic component module 3 accommodated in the electrical connection box 1. The other end of each of the electric wires W is connected to a corresponding device (external equipment), such as a battery or an electrical component, through a connector and the like.

The electronic component module 3 includes an engagement structure 100 to be described below, and can improve the reliability of an engagement mechanism 9. The engagement structure 100 can reduce rattle of a substrate 6 (refer to FIGS. 3 and 6) against a cover 4. The engagement structure 100 includes a connector block 5, the cover 4, the engagement mechanism 9, and projections 55 (refer to FIG. 3). The electronic component module 3 includes electronic components (such as resistors 6b and relays 6c illustrated in FIG. 3), and the engagement structure 100.

The frame 2 illustrated in FIGS. 1 and 2 holds therein the electronic component module 3. The frame 2 is integrally formed of, for example, a synthetic resin. The frame 2 is a tubular member, and the planar shape thereof is, for example, a polygonal shape, such as a rectangular shape. The electronic component module 3 is inserted into the frame 2, or pulled out of the frame 2, from an opening of the frame 2. The electrical connection box 1 includes an upper cover and a lower cover (both not illustrated) that close the openings of the frame 2. The frame 2 constitutes, together with the upper cover and the lower cover, a closed accommodation space for accommodating the electronic component module 3.

The electronic component module 3 includes the cover 4 and the connector block 5. The cover 4 is an accommodation member having a substantially cuboid shape. The cover 4 is integrally formed of, for example, a synthetic resin. The cover 4 includes therein an accommodation portion 7 (refer to FIG. 5) that accommodates the substrate 6 (refer to FIG. 3) to be described later. The cover 4 includes a front first sidewall 41, a rear first sidewall 42, a left second sidewall 43, a right second sidewall 44, and a back wall 45. The first sidewalls 41 and 42 and the second sidewalls 43 and 44 constitute a tubular portion having a substantially rectangular sectional shape. The back wall 45 closes one end of the tubular portion constituted by the sidewalls 41, 42, 43, and 44. The other end of the tubular portion is open. In other words, the sidewalls 41, 42, 43, and 44 and the back wall 45 constitute a rectangular tube opened at one end thereof.

The electronic component module 3 of the present embodiment is mounted on the vehicle in an attitude in which an axis of the tubular portion constituted by the sidewalls 41, 42, 43, and 44 extends in the up-down direction, and an opening of the cover 4 faces downward. In the following description, the "up-down direction" refers to the vehicle up-down direction in the state in which the electrical connection box 1 including the electronic component module 3 is mounted on the vehicle. The longer direction of a sectional shape of the cover 4 formed by a plane orthogonal to the up-down direction will be called the "transverse direction", and the shorter direction of the sectional shape will be called the "longitudinal direction". The transverse direction is orthogonal to the longitudinal direction. In the present embodiment, the "left side" and the "right side" refer to the left side and the right side when a viewer directly faces the front first sidewall 41 that is one of the first sidewalls 41 and 42. The "front side" and the "rear side" refer to the near side and the far side when the viewer directly faces the front first sidewall 41.

The pair of first sidewalls 41 and 42 face each other in the longitudinal direction. The pair of second sidewalls 43 and 44 face each other in the transverse direction. One end in the longitudinal direction of each of the second sidewalls 43 and 44 is connected to the front first sidewall 41, and the other end thereof is connected to the rear first sidewall 42. The outer surface of each of the second sidewalls 43 and 44 is provided with an engagement portion 46. The engagement portion 46 is a projection having a substantially U-shaped planar shape. The frame 2 includes engagement projections corresponding to the engagement portions 46. The engagement portions 46 engage with the engagement projections of the frame 2 so as to connect the cover 4 with the frame 2.

As illustrated in FIGS. 1 and 5, the vicinities of the lower ends of the first sidewalls 41 and 42 are respectively provided with a plurality of recessed engagement portions 41b and a plurality of recessed engagement portions 42b. The recessed engagement portions 41b and 42b of the present embodiment are through-holes penetrating the first sidewalls 41 and 42, respectively, in the thickness direction thereof. The recessed engagement portions 41b are arranged along the lower side of the front first sidewall 41. The recessed engagement portions 42b are arranged along the lower side of the rear first sidewall 42. The recessed engagement portions 41b are arranged at intervals, and the recessed engagement portions 42b are arranged at intervals. The first sidewalls 41 and 42 of the present embodiment are respectively provided with three such recessed engagement portions 41b and three such recessed engagement portions 42b. One of the three recessed engagement portions 41b and one of the three recessed engagement portions 42b are arranged at the center in the transverse direction, and the other two of the three recessed engagement portions 41b and the other two of the three recessed engagement portions 42b are arranged on one side and the other side in the transverse direction.

As illustrated in FIG. 2, the frame 2 includes a module accommodation portion 2a that accommodates the electronic component module 3. The frame 2 of the present embodiment includes a plurality of such module accommodation portions 2a. The electronic component module 3 including the cover 4 is inserted into the module accommodation portion 2a, and is held by the frame 2.

The connector block 5 is a block that holds electronic components. The connector block 5 is a block-shaped member that closes the opening of the cover 4. The connector block 5 is integrally formed of, for example, a synthetic resin. An end face 51 of the connector block 5 is provided with a plurality of connector engagement portions 52. The connector engagement portions 52 are frame-like constitutional parts projecting from the end face 51. The connector engagement portions 52 include recesses 52a into which mating male connectors fit. A plurality of terminals 53 project from the bottoms of the recesses 52a. The terminals 53 are electrically connected to terminals of the mating connectors.

As illustrated in FIG. 3, the connector block 5 holds the substrate 6. The substrate 6 is, for example, a printed-circuit board, on a surface of which wiring of electrical circuitry is formed. The planar shape of the substrate 6 of the present embodiment is a rectangular shape with corners 6g and 6h chamfered into circular arc shapes. One end side of the substrate 6 is fixed to fixing portions 56 of the connector block 5 with fastening members, such as screws. The fixing portions 56 are provided at both ends in the transverse direction with the terminals 53 interposed therebetween. In the following description, a side of the substrate 6 fixed to the connector block 5 will be called the "proximal end side", and a free end side on the opposite side of the side fixed to the connector block 5 will be called the "distal end side". The substrate 6 and the connector block 5 are inserted into the cover 4 from a distal end face 6d.

The substrate 6 has a plurality of through-holes 6a on the proximal end side. The through-holes 6a penetrate the substrate 6 in the thickness direction thereof. The terminals 53 having conductivity are inserted in the respective through-holes 6a. Each of the terminals 53 is a bar-like or plate-like member bent at a right angle, and is inserted at one end thereof in corresponding one of the through-holes 6a from one face side (front side) of the substrate 6. The other ends of the terminals 53 project toward the inside of the recesses 52a of the connector block 5, as described above. The terminals 53 are soldered to be electrically connected to the electrical circuitry of the substrate 6. The electronic components, such as the resistors 6b and the relays 6c, are electrically connected to the electrical circuitry of the substrate 6, thus constituting an electronic circuit as a whole.

The connector block 5 includes projecting engagement portions 54. The projecting engagement portions 54 are projections corresponding to the recessed engagement portions 41b and 42b of the cover 4 (refer to FIGS. 1 and 5). Each of the projecting engagement portions 54 has an engagement surface 54a. The engagement surface 54a is a plane facing downward, and is, for example, a plane orthogonal to the up-down direction. The projecting engagement portions 54 are provided on a front first side surface 5a and a rear first side surface 5b of the connector block 5. The first side surfaces 5a and 5b are side surfaces along the longer direction of the connector block 5, in other words, side surfaces extending in the transverse direction on the connector block 5. Each of the first side surfaces 5a and 5b faces the longitudinal direction. The first side surfaces 5a and 5b are surfaces facing first inner wall surfaces 41a and 42a of the cover 4. In more detail, the front first side surface 5a faces the front first inner wall surface 41a serving as an inner wall surface of the front first sidewall 41, and the rear first side surface 5b faces the rear first inner wall surface 42a serving as an inner wall surface of the rear first sidewall 42. The projecting engagement portions 54 project toward the longitudinal directions from the first side surfaces 5a and 5b. The projecting engagement portions 54 are provided on the first side surfaces 5a and 5b as follows: one at the central part of each thereof, and one at each of both ends in the transverse direction thereof.

The projecting engagement portions 54 engage with the recessed engagement portions 41b and 42b to connect the cover 4 with the connector block 5. In more detail, the projecting engagement portions 54 enter the recessed engagement portions 41b and 42b from the inside, that is, from the sides of the first inner wall surfaces 41a and 42a. The engagement surfaces 54a of the projecting engagement portions 54 engage with the recessed engagement portions 41b and 42b to restrict the connector block 5 from coming out of the cover 4.

A left second side surface 5c and a right second side surface 5d are side surfaces along the shorter direction of the connector block 5, in other words, side surfaces extending in the longitudinal direction on the connector block 5. Each of the left and right second side surfaces 5c and 5d faces the transverse direction. The second side surfaces 5c and 5d are surfaces facing second inner wall surfaces 43a and 44a of the cover 4. In more detail, the left second side surface 5c faces the left second inner wall surface 43a serving as an inner wall surface of the left second sidewall 43, and the right second side surface 5d faces the right second inner wall surface 44a serving as an inner wall surface of the right second sidewall 44.

The second side surfaces 5c and 5d of the connector block 5 are provided with the projections 55. The projections 55 press the second inner wall surfaces 43a and 44a. As will be described below, the projections 55 press the second inner wall surfaces 43a and 44a so as to restrain reduction in amounts of engagement overlap of the engagement mechanism 9 constituted by the projecting engagement portions 54 and the recessed engagement portions 41b and 42b. The projections 55 project toward the transverse directions from the second side surfaces 5c and 5d. The projections 55 are line-shaped or ridge-shaped projections extending in the up-down direction, in other words, along the direction of insertion of the substrate 6. Two such projections 55 (a front projection 55a and a rear projection 55b) are arranged on each of the second side surfaces 5c and 5d on the connector block 5 of the present embodiment. The front projection 55a is provided at an end on the front first side surface 5a side of each of the second side surfaces 5c and 5d. The rear projection 55b is provided at an end on the rear first side surface 5b side of each of the second side surfaces 5c and 5d. That is, the projections 55 are located at ends on the sides of the first side surfaces 5a and 5b on the second side surfaces 5c and 5d.

The shape of the connector block 5 will be described in more detail with reference to FIG. 4. As illustrated in FIG. 4, the shape (planar shape) of the connector block 5 is substantially rectangular when viewed from above. The rear first side surface 5b projects toward the longitudinal direction slightly more at the central part than at both ends thereof. More specifically, the rear first side surface 5b includes a central part $5b_1$ and inclined parts $5b_2$ and $5b_3$. Grooves $5b_4$ and $5b_5$ extending in the up-down direction are provided between the central part $5b_1$ and the inclined parts $5b_2$ and $5b_3$. The central part $5b_1$ is a central part in the transverse direction on the rear first side surface 5b. The inclined part $5b_2$ is a part on the left side of the central part $5b_1$, and the inclined part $5b_3$ is a part on the right side of the central part $5b_1$. The central part $5b_1$ is a surface parallel to the front first side surface 5a. Each of the inclined parts $5b_2$ and $5b_3$ is inclined so as to be closer to the front first side surface 5a as the distance from the central part $5b_1$ increases toward the transverse direction. Ends on the central part $5b_1$ side of the inclined parts $5b_2$ and $5b_3$ are located at substantially the same locations in the longitudinal direction as the central part $5b_1$. Corresponding to the shape of the rear first side surface 5b, the rear first sidewall 42 projects toward the longitudinal direction slightly more at the central part than at both ends thereof.

Of the two projections 55 provided on each of the second side surfaces 5c and 5d, the rear projection 55b is disposed at an end on the side of the rear first side surface 5b. In more detail, the rear projection 55b is disposed adjacent to a circular arc part 5e located at a part where each of the second side surfaces 5c and 5d intersects the rear first side surface 5b. The front projection 55a is disposed at an end on the side of the front first side surface 5a. In more detail, the connector block 5 includes an inclined surface 5f that connects the front first side surface 5a with each of the second side surfaces 5c and 5d. The inclined surface 5f is a surface inclined with respect to the front first side surface 5a and each of the second side surfaces 5c and 5d. The front projection 55a is disposed adjacent to a corner where the inclined surface 5f intersects each of the second side surfaces 5c and 5d.

Referring back to FIG. 3, the projections 55 are provided on the lower end side of the connector block 5. In more detail, the projections 55 extend upward from flange portions 57 in predetermined ranges. The flange portions 57 are flange-like projections projecting toward the transverse direction from the lower ends of the second side surfaces 5c and 5d. The flange portions 57 serve as stoppers that abut on an end on the opening side of the cover 4.

As illustrated in FIG. 5, the cover 4 includes an accommodation portion 7. The accommodation portion 7 is a space surrounded by the first sidewalls 41 and 42, the second sidewalls 43 and 44, and the back wall 45. In other words, the accommodation portion 7 is an internal space of the cover 4 having a bottomed tubular shape. Each of the second sidewalls 43 and 44 of the cover 4 includes a first guide portion 47, a second guide portion 48, and a projection 49. The guide portions 47 and 48 and the projection 49 are provided on each of the second inner wall surfaces 43a and 44a of the second sidewalls 43 and 44. The second inner wall surfaces 43a and 44a are surfaces facing side surfaces 6e and 6f of the substrate 6 (refer to FIG. 3). The first and second guide portions 47 and 48 extend in the up-down direction, in other words, along the depth direction of the accommodation portion 7. The first and second guide portions 47 and 48 face each other in the longitudinal direction. The first and second guide portions 47 and 48 are formed integrally with each of the second sidewalls 43 and 44.

A groove 8 is provided between the first guide portion 47 and the second guide portion 48. The first and second guide portions 47 and 48 guide the substrate 6 inserted into the accommodation portion 7 to the groove 8. The projection 49 is a salient portion projecting from each of the second inner wall surfaces 43a and 44a, and is formed integrally with each of the second sidewalls 43 and 44. The shape of the projection 49 of the present embodiment is a triangular prismatic shape, and extends in the longitudinal direction. Both ends of the projection 49 are connected to the first and second guide portions 47 and 48, respectively. The distance between the distal end of the projection 49 of the left second sidewall 43 and the distal end of the projection 49 of the right second sidewall 44 is smaller than a width W1 of the substrate 6 (refer to FIG. 3). The projection 49 is a crushable rib that is plastically deformed by coming into contact with the substrate 6 inserted into the accommodation portion 7.

The substrate 6 is inserted toward the back wall 45 from an opening 4a of the cover 4. More specifically, the connector block 5 and the substrate 6 are inserted into the accommodation portion 7 toward the back wall 45 from the opening 4a, the distal end face 6d of the substrate 6 serving as the leading end. The accommodation portion 7 of the cover 4 accommodates therein the inserted substrate 6, and accommodates at least a part of the connector block 5. The connector block 5 inserted in the accommodation portion 7 closes the opening 4a of the cover 4 to form a closed space accommodating the substrate 6 in the cover 4.

When the connector block 5 is inserted in the accommodation portion 7, as illustrated in FIG. 1, the projecting engagement portions 54 of the connector block 5 enter the recessed engagement portions 41b and 42b from inside the cover 4, and engage with the recessed engagement portions 41b and 42b. The projecting engagement portions 54 engaged with the recessed engagement portions 41b and 42b restrict the connector block 5 from coming out of the accommodation portion 7. The cover 4 covers the connector block 5, the substrate 6, and the electronic components, such as the resistors 6b and the relays 6c, in an integrated manner.

When the substrate 6 inserted into the accommodation portion 7 abuts on the projections 49, parts of the projections 49 abutting on the substrate 6 are plastically deformed. The material (strength), shape, dimensions, and the like of the projection 49 are determined so that at least a part on the distal end side thereof is plastically deformed to crush on contact with the substrate 6. The material (elastic modulus), shape, dimensions, and the like of the projection 49 are desirably determined so that at least a part on the proximal end side thereof can be elastically deformed to maintain the contact state between the projection 49 and the substrate 6. At completion of the insertion of the substrate 6 into the accommodation portion 7, a groove is formed on the projection 49 by the plastic deformation to pinch the substrate 6 from both sides thereof in the longitudinal direction. While the groove of the projection 49 desirably holds the substrate 6 by coming into contact with the substrate 6, a gap may be present between the projection 49 and the substrate 6 in some cases.

The projections 49 restrain displacement of the substrate 6 relative to the cover 4. As illustrated in FIG. 6, the pair of projections 49 opposed in the transverse direction restrain the displacement of the substrate 6 relative to the cover 4 in the transverse direction. The projection 49 of the left second sidewall 43 reduces the movable range of the substrate 6 toward the left second inner wall surface 43a. The projection 49 of the right second sidewall 44 reduces the movable range of the substrate 6 toward the right second inner wall surface 44a. In this manner, the pair of projections 49 restrict the displacement of the substrate 6 relative to the cover 4 in the transverse direction.

The grooves formed on the projections 49 by the plastic deformation pinch the substrate 6 from both sides thereof in the longitudinal direction to restrict the displacement of the substrate 6 relative to the cover 4 in the longitudinal direction. Thus, the projections 49 of the present embodiment restrain the cover 4 and the substrate 6 from moving independently of each other when the vehicle vibrates, in other words, restrain occurrence of separate vibrations independent between the cover 4 and the substrate 6.

As illustrated in FIG. 6, the projections 55 come into contact with the second inner wall surfaces 43a and 44a of the cover 4, and press the second inner wall surfaces 43a and 44a. The projections 55 are disposed so as to be capable of coming into contact with and pressing the second inner wall surfaces 43a and 44a at least in the state in which the engagement mechanism 9 is engaged. The projecting amounts of the projections 55 are determined so that the projections 55 on the left second side surface 5c press the left second inner wall surface 43a, and the projections 55 on the right second side surface 5d press the right second inner wall surface 44a. In other words, the projections 55 are configured such that the connector block 5 is pressed into the cover 4 in the state in which the projections 55 on the left second side surface 5c are in contact with the left second inner wall surface 43a, and the projections 55 on the right second side surface 5d are in contact with the right second inner wall surface 44a.

The projections 55 press the second inner wall surfaces 43a and 44a so as to restrain the first side surfaces 5a and 5b and the first inner wall surfaces 41a and 42a from relatively moving in separating directions. For example, as illustrated in FIG. 7, pressing forces F1 acting from the projections 55 on the second inner wall surfaces 43a and 44a deforms the cover 4. In FIG. 7, dashed lines represent the shape of the cover 4 before being deformed, and the solid lines represent the shape of the cover 4 after being deformed. As illustrated in FIG. 7, the cover 4 is deformed so that the first inner wall surfaces 41a and 42a get close to the first side surfaces 5a and 5b. More specifically, the cover 4 is deformed inward so that a deformation amount u increases from both ends toward the central part in the transverse direction of the first sidewalls 41 and 42. Since the deformation amount u is larger at the central part as described above, it is desirable to provide at least one of the projecting engagement portions 54 at the central part in the transverse direction of each of the first side surfaces 5a and 5b, and to provide at least one of the recessed engagement portions 41b and 42b corresponding to the provided projecting engagement portion 54 at the central part of each of the first sidewalls 41 and 42.

The projections 55 deforms the cover 4 so as to increase the amounts of engagement overlap of the engagement mechanism 9 constituted by the projecting engagement portions 54 and the recessed engagement portions 41b and 42b. The term "amounts of engagement overlap" refers to lengths of the overlap in the longitudinal direction between the projecting engagement portions 54 and the recessed engagement portions 41b and 42b. Increasing the amounts of engagement overlap restrains unintended release of the engagement mechanism 9. For example, the projecting engagement portions 54 are restrained from coming out of the recessed engagement portions 41b and 42b due to vibration or impact.

The pressing forces F1 from the projections 55 apply tensions F2 to the first sidewalls 41 and 42. The tensions F2 restrain the deformation of the first sidewalls 41 and 42 toward the longitudinal directions. That is, the tensions F2 restrain the first side surfaces 5a and 5b and the first inner wall surfaces 41a and 42a from relatively moving in separating directions. The projections 55 restrain the deformation of the first sidewalls 41 and 42 in a direction of reducing the amounts of engagement overlap of the engagement mechanism 9, and thus improves stability of the engagement state of the engagement mechanism 9. Consequently, the projections 55 of the present embodiment can improve the reliability of the engagement mechanism 9 by restraining the unintended release of the engagement state of the engagement mechanism 9.

In the present embodiment, the projections 55 are located at the ends on the sides of the first side surfaces 5a and 5b on the second side surfaces 5c and 5d. Disposing the projections 55 at the ends of the second side surfaces 5c and 5d reduces the projecting amounts of the projections 55 required to generate the same amount of deformation of the first sidewalls 41 and 42. Disposing the projections 55 at the ends of the second side surfaces 5c and 5d also reduces the projecting amounts of the projections 55 required to generate the same amount of tensions F2.

As will be described with reference to FIGS. 8 and 9, the frame 2 of the present embodiment includes frame-side projections 21 that restrain displacement of the cover 4 relative to the frame 2. The frame-side projections 21 are provided on wall surfaces in the frame 2 facing the cover 4. The frame-side projections 21 of the present embodiment are provided on the wall surfaces in the frame 2 facing the respective second sidewalls 43 and 44. In other words, the frame-side projections 21 are provided on the wall surfaces facing each other in the transverse direction with the cover 4 interposed therebetween. FIGS. 8 and 9 illustrate a wall surface 22 in the frame 2 facing the right second sidewall 44, and also illustrate the frame-side projections 21 provided on the wall surface 22. The frame-side projections 21 provided on a wall surface facing the left second sidewall 43 are the same as the frame-side projections 21 provided on the wall surface 22.

The frame-side projections 21 project from the wall surface 22 toward the inside of the module accommodation portion 2a. In the frame 2 of the present embodiment, a pair of ribs 23 and 23 project from the wall surface 22, as illustrated in FIG. 8. The rib 23 is a projection having a rectangular sectional shape, and extends in the up-down direction. For example, an engagement projection for engaging with the engagement portion 46 of the cover 4 (refer to FIG. 1) is provided between the pair of ribs 23 and 23. Each of the frame-side projections 21 is provided on the distal end surface of the rib 23. As illustrated in FIG. 9, the frame-side projection 21 is provided in a predetermined range from the lower end of the module accommodation portion 2a upward. The sectional shape of the frame-side projection 21 is a tapered shape having a width in the longitudinal direction decreasing toward the distal end side in the projecting direction of the frame-side projection 21.

The frame-side projection 21 is a crushable rib that is plastically deformed by coming into contact with the cover 4 inserted into the module accommodation portion 2a. When the cover 4 inserted into the module accommodation portion 2a comes into contact with the frame-side projection 21, a portion of the frame-side projection 21 in contact with the cover 4 is plastically deformed. The cover 4 is inserted into the module accommodation portion 2a, for example, from therebelow with the back wall 45 facing upward. The outer wall surfaces of the second sidewalls 43 and 44 of the cover 4 are located more outside sideways at portions on the trailing end side (opening 4a side) thereof than at portions on the leading end side (back wall 45 side) thereof in the direction of insertion. That is, on the outer wall surfaces of the cover 4, portions that face the frame-side projections 21 when being inserted into the module accommodation portion 2a are more expanded toward the transverse direction on the trailing end side than on the leading end side. The leading end portions of the cover 4 can be inserted into the module accommodation portion 2a without coming into contact with the frame-side projections 21. In contrast, the trailing end portions of the cover 4 come into contact with the frame-side projections 21 to plastically deform the frame-side projections 21. The cover 4 is inserted into the module accommodation portion 2a until the engagement projections of the frame 2 engage with the engagement portions 46 while plastically deforming the frame-side projections 21. The cover 4 is held by the frame-side projections 21 in the state of being accommodated in the module accommodation portion 2a. The frame-side projections 21 restrict the displacement of the cover 4 relative to the frame 2 in the transverse direction. The frame-side projections 21 can also restrict the displacement of the cover 4 relative to the frame 2 in the longitudinal direction.

In this manner, in the electrical connection box 1 of the present embodiment, the second sidewalls 43 and 44 of the cover 4 are held from both surfaces thereof by the projections 55 and the frame-side projections 21. This reduces both the rattle of the cover 4 and the substrate 6 against the frame 2 and the rattle of the substrate 6 against the cover 4. This, in turn, can reduce the influence of vibration on the electronic components and soldered parts of the substrate 6 in the electrical connection box 1 of the present embodiment. In the present embodiment, as illustrated in FIG. 8, the projections 55 face the frame-side projections 21 in the transverse direction with the second sidewalls 43 and 44 interposed therebetween. This appropriately reduces the rattle of the cover 4. Although the projections 55 preferably coincide with the frame-side projections 21 in positions in the longitudinal direction, the positions may be slightly mismatched in the longitudinal direction, as illustrated in the present embodiment.

As describe above, the engagement structure 100 of the present embodiment includes the connector block 5, the cover 4, the engagement mechanism 9, and the projections 55. The connector block 5 includes the first side surfaces 5a and 5b and the second side surfaces 5c and 5d, and holds the electronic components, such as the resistors 6b and the relays 6c, through the substrate 6. The cover 4 includes the first inner wall surfaces 41a and 42a facing the first side surfaces 5a and 5b and the second inner wall surfaces 43a and 44a facing the second side surfaces 5c and 5d. The cover 4 covers the connector block 5 and the electronic components, such as the resistors 6b and the relays 6c, in an integrated manner.

The engagement mechanism 9 includes the projecting engagement portions 54 provided on the first side surfaces 5a and 5b and the recessed engagement portions 41b and 42b provided in the first inner wall surfaces 41a and 42a. The first side surfaces 5a and 5b approach and depart from the first inner wall surfaces 41a and 42a so as to engage and disengage the engagement mechanism 9. The projections 55 are provided on the second side surfaces 5c and 5d. In the engaged state of the engagement mechanism 9, the projections 55 are in contact with the second inner wall surfaces 43a and 44a, and press the second inner wall surfaces 43a and 44a so as to restrain the first side surfaces 5a and 5b and the first inner wall surfaces 41a and 42a from relatively moving in separating directions. The engagement structure 100 according to the present embodiment restrains the relative movement of the first inner wall surfaces 41a and 42a in the direction separating from the first side surfaces 5a and 5b so as to be capable of restraining the unintended release of the engagement mechanism 9 caused by vibration, impact, or the like. As a result, the engagement structure 100 can improve the reliability of the engagement mechanism 9.

The projections 55 press the second inner wall surfaces 43a and 44a to deform the cover 4 so that the first side surfaces 5a and 5b get close to the first inner wall surfaces 41a and 42a. In other words, the projections 55 deform the cover 4 with the pressing forces F1 pressing the second inner wall surfaces 43a and 44a so as to increase the amounts of engagement overlap of the engagement mechanism 9. The projections 55 appropriately restrain the unintended release of the engagement mechanism 9 to improve the reliability of the engagement mechanism 9.

In the engagement structure 100 of the present embodiment, the second side surfaces 5c and 5d are surfaces intersecting the first side surfaces 5a and 5b, and the projections 55 are located at the ends on the sides of the first side surfaces 5a and 5b on the second side surfaces 5c and 5d. The projections 55 provided adjacent to the first side surfaces 5a and 5b can facilitate such deformation of the cover 4 as to increase the amounts of engagement overlap of the engagement mechanism 9. The projections 55 provided adjacent to the first side surfaces 5a and 5b generate the appropriate tensions in the second sidewalls 43 and 44 so as to be capable of restraining the deformation of the second sidewalls 43 and 44 in the direction of reducing the amounts of engagement overlap of the engagement mechanism 9.

The electronic component module 3 of the present embodiment includes, in addition to the electronic components, the connector block 5, the cover 4, the engagement mechanism 9, and the projections 55 according to the engagement structure 100 described above. The electronic component module 3 of the present embodiment can improve the reliability of the engagement mechanism 9 by including the engagement structure 100 described above.

The electrical connection box 1 of the present embodiment includes the electronic component module 3 described above and the frame 2 holding therein the electronic component module 3. The electrical connection box 1 of the present embodiment can improve the reliability of the engagement mechanism 9 by including the engagement structure 100 described above.

Modification of Embodiment

The number of the projections 55 provided on the second side surfaces 5c and 5d is not limited to the number exemplified above. For example, one such projection 55 may be provided on each of the second side surfaces 5c and 5d. In this case, the projection 55 is desirably disposed at the central part in the longitudinal direction of each of the second side surfaces 5c and 5d. The shape of the projection 55 is not limited to the shape exemplified above. The planar shape of the projection 55 may be, for example, a dot shape, instead of the line shape or the ridge shape. The width of the projection 55 may be larger than the width illustrated in the drawings. The projection 55 may extend in a horizontal direction, instead of in the up-down direction. The projection 55 may be provided on only one of the second side surfaces 5c and 5d.

In the embodiment described above, the side surfaces in the longer direction of the connector block 5 serve as the first side surfaces 5a and 5b, and the side surfaces in the shorter direction of the connector block 5 serve as the second side surfaces 5c and 5d. However, conversely to this, the side surfaces in the shorter direction may serve as the first side surfaces 5a and 5b, and the side surfaces in the longer direction may serve as the second side surfaces 5c and 5d.

While the shape in the plan view of the connector block 5 of the embodiment described above is substantially rectangular, the shape is not limited to this. The planar shape of the connector block 5 may be a polygonal shape other than the rectangular shape, or a shape based on the polygonal shape. The first side surfaces 5a and 5b need not be adjacent to the second side surfaces 5c and 5d. The first side surfaces 5a and 5b desirably intersect the second side surfaces 5c and 5d, but need not be orthogonal thereto.

The first side surface and the second side surface may be provided on different sides (back to back) with the main part of the connector block 5 interposed therebetween. For example, on the connector block 5 of the embodiment described above (refer to FIGS. 3 and 4), the surface called the front first side surface 5a may serve as the second side surface. The second side surface (surface called the front first side surface 5a) is provided with the projections 55 instead of the projecting engagement portions 54. In this case, the surface called the front first inner wall surface 41a in the embodiment described above serves as a second inner wall surface. The projections 55 press the second inner wall surface (surface called the front first inner wall surface 41a) of the cover 4. This pressing force is a force in a direction causing the rear first side surface 5b and the rear first inner wall surface 42a to get close to each other. As a result, the projections 55 restrain the first side surface and the first inner wall surface from relatively moving in separating directions.

In the embodiment described above, the first side surfaces 5a and 5b are provided with the projecting engagement portions 54, and the first sidewalls 41 and 42 are provided with the recessed engagement portions 41b and 42b. Instead of this, however, the first sidewalls 41 and 42 may be provided with projecting engagement portions, and the first side surfaces 5a and 5b may be provided with recessed engagement portions. The projections 55 may be provided on the second inner wall surfaces 43a and 44a instead of on the second side surfaces 5c and 5d.

The content disclosed in the embodiment and the modification thereof described above may be carried out in appropriate combinations thereof.

An engagement structure, an electronic component module, and an electrical connection box according to the embodiment include each a block that has a first side surface and a second side surface, and that holds an electronic component; a cover that has a first inner wall surface facing the first side surface and a second inner wall surface facing the second side surface, and that covers the block and the electronic component in an integrated manner; an engagement mechanism that includes a projecting engagement portion provided on one of the first side surface and the first inner wall surface and an recessed engagement portion provided in the other of the first side surface and the first inner wall surface; and a projection that is provided on one surface of the second side surface and the second inner wall surface, and configured to be in contact with the other surface of the second side surface and the second inner wall surface to press the other surface so as to restrain the first side surface and the first inner wall surface from relatively moving in directions separating from each other in an engaged state of the engagement mechanism. The engagement structure, the electronic component module, and the electrical connection box according to the embodiment provide the effect that the projection restrains the first side surface and the first inner wall surface from relatively moving in directions separating from each other so that the reliability of the engagement structure can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An engagement structure comprising:
    a block that has a first side surface and a second side surface, and that holds an electronic component;
    a cover that has a first inner wall surface facing the first side surface, and a second inner wall surface facing the second side surface, and that covers the block and the electronic component in an integrated manner;
    an engagement mechanism that includes a projecting engagement portion provided on one of the first side surface and the first inner wall surface and an recessed engagement portion provided in the other of the first side surface and the first inner wall surface, the recessed engagement portion is a through-hole, the projecting engagement portion enters the through-hole, and the porjecting engagement portion includes a projection surface that engages the through-hole; and
    a projection that is provided on one surface of the second side surface and the second inner wall surface, and configured to be in contact with the other surface of the second side surface and the second inner wall surface to press the other surface and deform the cover inward such that the first inner wall surface gets close to the first side surface and deformation amount increases from both ends toward a central part in the transverse direction of the first inner wall surface so as to restrain the first side surface and the first inner wall surface from relatively moving in directions separating from each other in an engaged state of the engagement mechanism.

2. The engagement structure according to claim 1, wherein the second side surface is a surface intersecting the first side surface, and the projection is located at an end on the first side surface side of the second side surface.

3. An electronic component module comprising:
an electronic component;
a block that has a first side surface and a second side surface, and that holds the electronic component;
a cover that has a first inner wall surface facing the first side surface and a second inner wall surface facing the second side surface, and that covers the block and the electronic component in an integrated manner;
an engagement mechanism that includes a projecting engagement portion provided on one of the first side surface and the first inner wall surface and an recessed engagement portion provided in the other of the first side surface and the first inner wall surface, the recessed engagement portion is a through-hole, the projecting engagement portion enters the through-hole, and the projecting engagement portion includes a projection surface that engages the through-hole; and
a projection that is provided on one surface of the second side surface and the second inner wall surface, and configured to be in contact with the other surface of the second side surface and the second inner wall surface to press the other surface and deform the cover inward such that the first inner wall surface gets close to the first side surface and deformation amount increases from both ends toward a central part in the transverse direction of the first inner wall surface so as to restrain the first side surface and the first inner wall surface from relatively moving in directions separating from each other in an engaged state of the engagement mechanism.

4. An electrical connection box comprising:
an electronic component;
a block that has a first side surface and a second side surface, and that holds the electronic component;
a cover that has a first inner wall surface facing the first side surface and a second inner wall surface facing the second side surface, and that covers the block and the electronic component in an integrated manner;
an engagement mechanism that includes a projecting engagement portion provided on one of the first side surface and the first inner wall surface and an recessed engagement portion provided in the other of the first side surface and the first inner wall surface, the recessed engagement portion is a through-hole, the projecting engagement portion enters the through-hole, and the projecting engagement portion includes a projection surface that engages the through-hole;
a projection that is provided on one surface of the second side surface and the second inner wall surface, and configured to be in contact with the other surface of the second side surface and the second inner wall surface to press the other surface and deform the cover inward such that the first inner wall surface gets close to the first side surface and deformation amount increases from both ends toward a central part in the transverse direction of the first inner wall surface so as to restrain the first side surface and the first inner wall surface from relatively moving in directions separating from each other in an engaged state of the engagement mechanism; and
a frame that holds therein an electronic component module including the electronic component, the block, and the cover.

* * * * *